(12) United States Patent
Gebhardt et al.

(10) Patent No.: US 11,719,737 B2
(45) Date of Patent: Aug. 8, 2023

(54) SENSING ARRANGEMENT

(71) Applicant: ABB Schweiz AG, Baden (CH)

(72) Inventors: Jörg Gebhardt, Mainz (DE); Holger Kaul, Mannheim (DE); Kai Hencken, Lörrach (DE)

(73) Assignee: ABB Schweiz AG, Baden (CH)

( * ) Notice: Subject to any disclaimer, the term of this patent is extended or adjusted under 35 U.S.C. 154(b) by 160 days.

(21) Appl. No.: 17/314,140

(22) Filed: May 7, 2021

(65) Prior Publication Data

US 2021/0349140 A1 Nov. 11, 2021

(30) Foreign Application Priority Data

May 8, 2020 (EP) ..................................... 20173774

(51) Int. Cl.
*G01R 31/327* (2006.01)
*G01R 31/12* (2020.01)
(Continued)

(52) U.S. Cl.
CPC ..... *G01R 31/1209* (2013.01); *G01R 31/3271* (2013.01); *H04R 1/04* (2013.01);
(Continued)

(58) Field of Classification Search
CPC ................ G01R 31/12; G01R 31/1209; G01R 31/3271; G01R 31/1227; G01R 31/1272; G01R 31/1254; G01R 31/1263; G01R 31/1281; G01R 31/14; G01R 31/02; G01R 31/08; G01R 31/081; G01R 31/11; G01R 31/16; G01R 31/28; G01R 31/085;
(Continued)

(56) References Cited

U.S. PATENT DOCUMENTS 4,607,186 A * 8/1986 Takayama ............... H04R 17/10
310/322
9,860,636 B1 1/2018 Nongpiur
(Continued)

FOREIGN PATENT DOCUMENTS

CN 205210248 * 6/2016
CN 209373040 * 9/2019
(Continued)

OTHER PUBLICATIONS

European Patent Office, Extended Search Report issued in corresponding Application No. 20173774.9, dated Oct. 8, 2020, 9 pp.
(Continued)

*Primary Examiner* — Thang X Le
(74) *Attorney, Agent, or Firm* — Armstrong Teasdale LLP

(57) ABSTRACT

A sensing arrangement for detection of electrical discharges in an electrical apparatus is described. The sensing arrangement includes an acoustic sensor and a signal enhancing structure with a funnel region. The acoustic sensor is positioned outside the funnel region on an apex side of the funnel region. An electrical switchgear is described. The electrical switchgear includes a sensing arrangement for detection of electrical discharges in an electrical apparatus. The sensing arrangement includes an acoustic sensor and a signal enhancing structure with a funnel region.

19 Claims, 2 Drawing Sheets

(51) Int. Cl.
*H04R 1/04* (2006.01)
*H04R 1/28* (2006.01)
*H04R 19/01* (2006.01)

(52) U.S. Cl.
CPC .......... *H04R 1/2884* (2013.01); *H04R 19/01*
(2013.01); *H04R 2201/003* (2013.01)

(58) Field of Classification Search
CPC ........ G01R 31/34; G01R 31/52; G01R 31/58;
G01R 31/62; G01R 31/346; G01R
31/343; H04R 1/04; H04R 1/2884; H04R
1/222; H04R 1/342
See application file for complete search history.

(56) References Cited

U.S. PATENT DOCUMENTS

| | | | | |
|---|---|---|---|---|
| 10,291,981 | B2* | 5/2019 | LaCarrubba | ............ H04R 1/30 |
| 2016/0327523 | A1* | 11/2016 | Shimoyama | ............ G01H 3/00 |
| 2018/0233827 | A1 | 8/2018 | Agranat et al. | |

FOREIGN PATENT DOCUMENTS

| | | |
|---|---|---|
| DE | 19514514 A1 | 10/1996 |
| DE | 102014224605 A1 | 10/2015 |
| GB | 413503 A | 7/1934 |
| GB | 705450 A | 3/1954 |
| GB | 1182960 A | 3/1970 |
| JP | 2009261202 A | 11/2009 |

OTHER PUBLICATIONS

Anderson, J.G., "Ultrasonic Detection and Location of Electric Discharges in Insulating Structures," Transactions of the American Institute of Electrical Engineers, Part III: Power Apparatus and Systems, IEEE, Jan. 1, 1956, vol. 75, No. 3, pp. 1193-1198.

"IEEE Guide for the Detection, Location and Interpretation of Sources of Acoustic Emissions from Electrical Discharges in Power Transformers and Power Reactors," IEEE Std C57.127-2018, IEEE Standard, Piscataway, New Jersey, Mar. 11, 2019, pp. 1-72.

* cited by examiner

SENSING ARRANGEMENT

FIELD OF THE DISCLOSURE

The present disclosure relates to a sensing arrangement for detection of electrical discharges, particularly partial discharges, in electrical apparatus like electrical switchgear. Embodiments of the disclosure relate to a sensing device, including an enclosure and a sensing arrangement according to embodiments described herein. Embodiments relate to electrical switchgear, including a sensing arrangement as described herein. Aspects of the present disclosure relate to a method for detecting electrical discharges, particularly partial discharges.

TECHNICAL BACKGROUND

Electrical discharges, particularly some types of partial discharges, in electrical apparatus can cause acoustic waves. The acoustic waves are generated by short pressure pulses induced in a surrounding medium, particularly gas, by the energy release associated with the electrical discharges. Acoustic waves, particularly characteristic sound patterns, may also be caused by external influences like maintenance work on the electrical apparatus, environmental circumstances, external machines or devices, or even by intruding animals. Presently, measurement of acoustic waves emanating from electrical apparatus like electrical switchgear occurs during infrequent inspection events. The inspections require skilled staff equipped with expensive measurement devices.

It is therefore an object of the present disclosure to overcome at least some of the above-mentioned problems in the prior art at least partially.

SUMMARY OF THE DISCLOSURE

In view of the above, a sensing arrangement for detection of electrical discharges in an electrical apparatus is provided. The sensing arrangement includes an acoustic sensor and a signal enhancing structure with a funnel region. The acoustic sensor is positioned outside the funnel region on an apex side of the funnel region.

In embodiments, a sensing device is provided, including an enclosure and a sensing arrangement as described in the present disclosure.

In embodiments, an electrical switchgear is provided, including a sensing arrangement as described in the present disclosure.

In embodiments, an electrical switchgear is provided, including a sensing arrangement for detection of electrical discharges in an electrical apparatus. The sensing arrangement includes an acoustic sensor and a signal enhancing structure with a funnel region.

According to an aspect of the present disclosure, a method is provided for detecting electrical discharges, particularly partial discharges.

Further advantages, features, aspects and details that can be combined with embodiments described herein are evident from the dependent claims, claim combinations, the description and the drawings.

BRIEF DESCRIPTION OF THE FIGURES

The details will be described in the following with reference to the figures, wherein.

DETAILED DESCRIPTION OF THE FIGURES AND OF EMBODIMENTS

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment can be applied to a corresponding part or aspect in another embodiment as well.

Figure 1A:
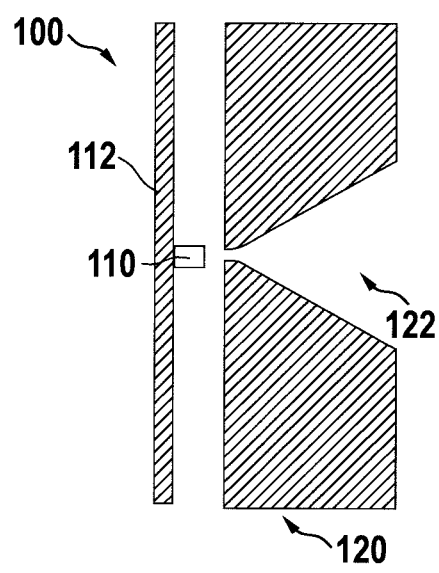
FIGS. 1a-1c are schematic cross-sectional views of sensing arrangements according to embodiments of the present disclosure.

FIG. 1a is a schematic cross-sectional view of a sensing arrangement for detection of electrical discharges, according to an embodiment of the present disclosure. The sensing arrangement 100 includes an acoustic sensor 110 and a signal enhancing structure 120. The signal enhancing structure has a funnel region 122. The signal enhancing structure is particularly an acoustic wave signal enhancing structure. The acoustic sensor 110 is positioned outside the funnel region 122 on an apex side of the funnel region. The acoustic sensor 110 may be attached to a printed circuit board 112.

The acoustic sensor may include or be a microphone, particularly a MEMS microphone. The MEMS microphone may be an off-the-shelf MEMS microphone. In particular, the MEMS microphone is similar or identical to MEMS microphones used in consumer products like smartphones. A sensing arrangement associated with low costs may be provided.

A distance between an apex of the funnel region and the acoustic sensor 110 may be smaller than for example 4, 3, or 2 mm. In embodiments, the acoustic sensor is positioned at the apex of the funnel region. The apex of the funnel region may also be understood as an origin of the funnel region.

The signal enhancing structure may be shaped so as to at least partly imitate an effect of the outer ear, particularly the auricle or the acoustic duct, of humans or animals. The sensing structure may substantially enhance the sensitivity of acoustic measurements, particularly regarding low amplitude signals.

Generally, for detection of electrical discharges, acoustic waves to be sensed are often quite weak. Detection procedures must often cope with a critically small signal-to-noise-ratio. Usually, particularly when standard MEMS microphones are used, failure to detect electrical discharges, particularly partial discharges, may result.

In the embodiment shown in FIG. 1, in the funnel region 122, a part of a surface of the signal enhancing structure 120 is a conical surface. Generally, in the funnel region 122, at least a part of a surface of the signal enhancing structure 120 may be a conical surface. The part of the surface may be for example larger than 25, 50 or 75% of a total surface of the signal enhancing structure in the funnel region. In the context of the present disclosure, the surface of the signal enhancing structure is particularly to be understood as an inner surface of the signal enhancing structure, more particularly in the funnel region. The shape of the signal enhancing structure may be at least partly comparable to the shape of an historical hearing aid device, particularly an ear trumpet.

The sensing arrangement may facilitate economically feasible online monitoring of acoustic emissions in electrical apparatus, particularly in electrical switchgear. In particular, continuous monitoring may be enabled In this and in other embodiments, a ratio between an entrance area and an exit area of the signal enhancing structure may be larger than 10. A ratio between an entrance area and an exit area of the signal enhancing structure may be smaller than 40000. The entrance area is particularly an area of the larger opening of the funnel region. The exit area is particularly an area of the smaller opening of the funnel region.

Figure 1B:
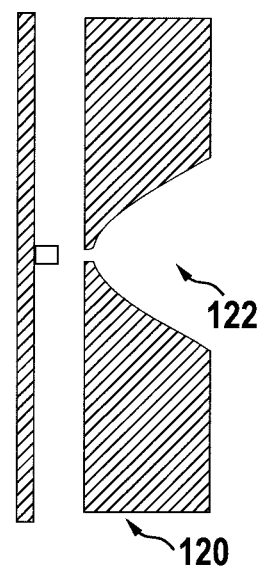

FIG. 1b is a schematic cross-sectional view of a sensing arrangement for detection of electrical discharges, according to an embodiment of the present disclosure. In the funnel region 122, a part of a surface of the signal enhancing structure 120 has a parabola-like cross section.

Generally, at least a part of a surface of the signal enhancing structure may have a parabola-like, particularly parabolic, cross section. The part of the surface may be for example larger than 25, 50 or 75% of a total surface of the signal enhancing structure in the funnel region. A measurement sensitivity of the sensing arrangement may be enhanced. The shape of the signal enhancing structure may be at least partly comparable to that of a directional microphone. The acoustic sensor is positioned outside the funnel region and thus particularly not in a focal point of the signal enhancing structure. Measurement sensitivity may be enhanced without undue increases in directional specificity. Acoustic signals arising from a large volume may be detected with high sensitivity.

Figure 1C:
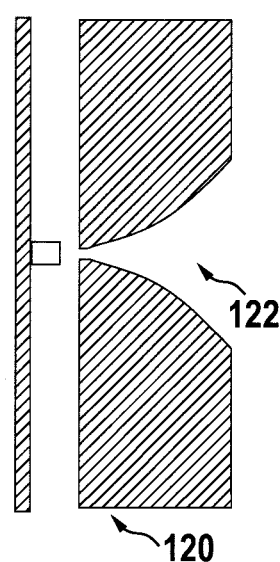

FIG. 1c is a schematic cross-sectional view of a sensing arrangement for detection of electrical discharges, according to an embodiment of the present disclosure. In the funnel region 122, a part of a surface of the signal enhancing structure 120 has an exponential-like cross section. Generally, at least a part of a surface of the signal enhancing structure may have an exponential-like, particularly an exponential-shaped, cross section. The part of the surface may be for example larger than 25, 50 or 75% of a total surface of the signal enhancing structure in the funnel region.

The shape of the signal enhancing structure may lead to enhancement of the measurement sensitivity, particularly via an increase of the sound amplitude. The transfer function of an exponential funnel is also characterized by its high pass characteristics. A suitable exponential shape may allow low frequencies to be filtered out.

Unwanted low-frequency acoustic waves may be filtered out due the acoustic frequency response transfer properties of the signal enhancing structure. A limit frequency can be defined deliberately by a suitable choice of the exponent of the funnel region's cross section. In a funnel where a cross section S changes with an axial position x exponentially, e.g. like:

$$S(x)=S(0)*\exp(2\in x),$$

wherein $\in$ is a real-valued opening factor, only waves with a frequency above a limit $$\omega_{limit}=\in c$$

can propagate. Here, c denotes the speed of sound in the medium under consideration.

In embodiments, the signal enhancing structure may be configured as a high-pass filter with a cutoff frequency lower than for example 16, 20, or 24 kHz. The signal enhancing structure may be configured as a high-pass filter with a cutoff frequency higher than for example 8, 10, or 12 kHz.

Figure 2:
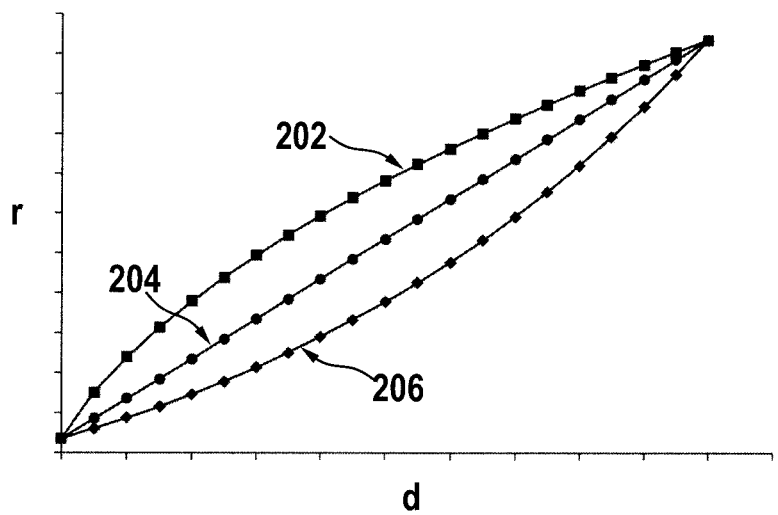
FIG. 2 is a graph illustrating exemplary cross-sections of a signal enhancing structure of a sensing arrangement according to embodiments of the present disclosure.

FIG. 2 is a graph illustrating exemplary cross-sections of a signal enhancing structure of a sensing arrangement according to embodiments of the present disclosure. The curves respectively relate to an upper half of a signal enhancing structure. The curves represent a radius r of the funnel region as a function of a distance d from an apex of the funnel region. In particular, the smaller opening of the funnel region is located at the apex of the funnel region. FIG. 2 shows a first curve 202 relating to a parabolic-profile funnel region, a second curve 204 relating to a cone-shaped funnel region, and a third curve 206 relating to an exponential-profile funnel region.

The smaller opening of the funnel region may have a diameter larger than for example 0.2, 0.4, or 0.6 mm. The smaller opening of the funnel region may have a diameter smaller than for example 0.8, 1.0, or 1.2 mm. For example, the smaller opening of the funnel region may have a diameter of 0.6, 0.7 or 0.8 mm.

The larger opening of the funnel region, corresponding to the right side of FIG. 2, may have a diameter larger than 16, 18, or 20 mm. The larger opening of the funnel region, may have a diameter smaller than 21, 23, or 25 mm. For example, the larger opening of the funnel region may have a diameter of 20.5, 20.7 or 20.9 mm.

Examples for possible curve functions, wherein d is measured in mm, are:

Cone-shape: $r \approx 0.35 \text{ mm} + d \text{ mm}$.

Parabola shape: $r \approx \left[-2.44 + 3.95(d-0.5)^{\frac{1}{2}}\right]$ mm

Exponential shape: $r \approx [-3.40 + 3.75*\exp(0.13d)]$ mm

In embodiments, the funnel may include a stem section. In the stem section, an inner surface of the signal enhancing structure may be a cylindrical surface. The stem section is not depicted in FIG. 2.

The overall enhancement of the pressure wave may be determined in large part by the overall ratio of the entrance and exit area of the funnel. An optimization regarding the acoustic transmission and enhancement factors may lead to a particularly good measurement sensitivity.

Generally, the various shapes of the signal enhancing structures described with regard to FIGS. 1-2 may also be combined. In a funnel region of a resulting sensing arrangement, a first part of a signal enhancing structure may have a cross section with a first shape and a second part of the signal enhancing structure may have cross section with a second shape. For example, a first part of the signal enhancing structure may have a conical surface and a second part of the signal enhancing structure may a have a parabola-like cross section.

Figure 3A:
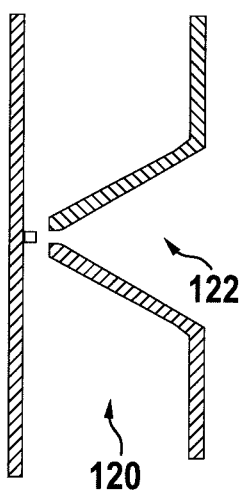
FIGS. 3a-3b are schematic cross-sectional views of sensing arrangements according to embodiments of the present disclosure.
Figure 3B:
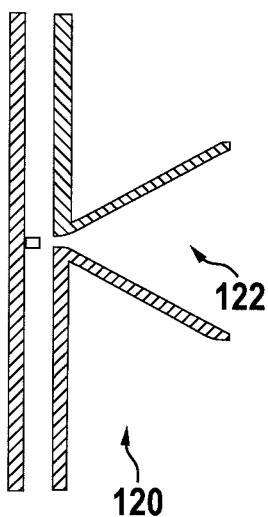

FIG. 3a is a schematic cross-sectional view of a sensing arrangement according to embodiments of the present disclosure. In contrast to the examples shown in FIGS. 1a-1c, the funnel region is not formed by a recess in a wall. Instead, the funnel region 122 is formed by a signal enhancing structure 120 having thin walls relative to an axial length of the funnel region 122. A ratio between the wall thickness of the structure and the axial length of the funnel region may be smaller than for example 0.3, 0.2, or 0.1. Material can be saved and a particularly lightweight sensing arrangement may be provided. FIG. 3b shows a variation of the sensing arrangement depicted in FIG. 3a.

Figure 4:
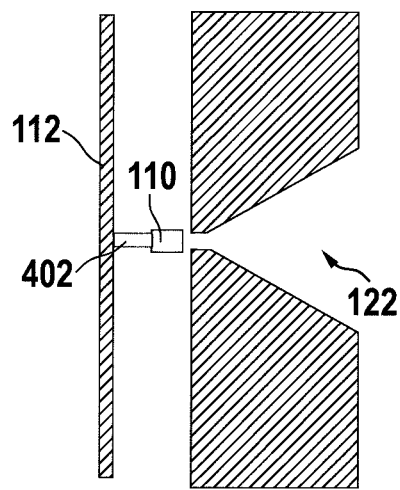
FIG. 4 is a schematic cross-sectional view of a sensing arrangement according to embodiments of the present disclosure.

FIG. 4 is a schematic cross-sectional view of a sensing arrangement according to embodiments of the present disclosure. The sensing arrangement corresponds at least substantially to the examples shown in FIGS. 1a-1c. As shown in FIG. 4, the acoustic sensor 110 may be positioned at a certain distance from the printed circuit board 112.

In embodiments, a distance between the acoustic sensor 110 and the printed circuit board 112 may be larger than for example 0.3, 0.5, or 1 mm. In the example shown in FIG. 4, the sensor 110 is positioned on a rod 402 attached to the printed circuit board 112. Generally, the acoustic sensor may be positioned on any structure that facilitates elevated mounting of the acoustic sensor.

Figure 5:
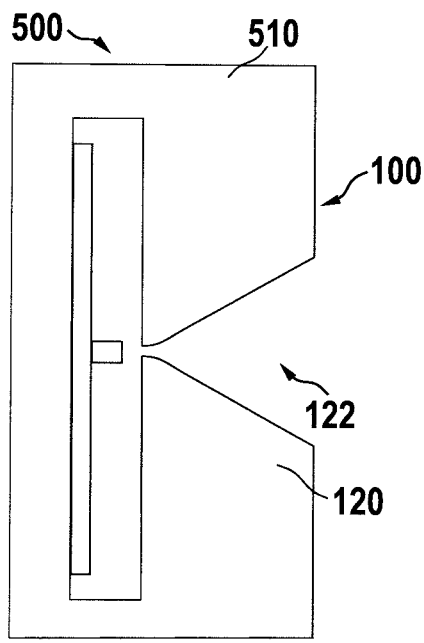
FIG. 5 is a schematic cross-sectional view of a sensing device according to embodiments of the present disclosure.

FIG. 5 is a schematic cross-sectional view of a sensing device according to embodiments of the present disclosure. The sensing device includes an enclosure 510 and a sensing arrangement 100 according to embodiments described herein. As shown in FIG. 5, the signal enhancing structure 120 of the sensing arrangement 100 may be embedded into the enclosure 510. In particular, the funnel region 122 is formed by a recess in the enclosure 510. A particularly compact sensing device may be provided. Structures protruding from the sensing device into open space may be avoided. For example, if the sensing device is positioned inside an electrical apparatus, structures protruding into an internal space, particularly a compartment, of the electrical apparatus may be avoided.

Analogously as described above with regard to a sensing device, the sensing arrangements described herein may also be incorporated into any other device. This is possible particularly since the proposed sensing structure is highly compact. In embodiments, the sensing structure may occupy a space in the range of for example less than 5, 3, or 2 cubic centimeters. The sensing structure may occupy for example approximately 1, 1.5, or 2 cubic centimeters. Including the sensing arrangement into devices typically present in an electrical apparatus like an electrical switchgear may be particularly advantageous. The sensing arrangement may be incorporated for example into a temperature sensor, an infrared sensor, a humidity sensor, or a communication unit.

According to another aspect, the sensing arrangements described herein may also be positioned outside the enclosure of an existing device, but use at least one of the electronic or support functions of the device. For example, the sensing structure may be configured to use a power supply or a communication connection of an existing device. Positioning the sensing arrangement at particularly advantageous points, e.g. close to parts which are strongly dielectrically loaded and therefore critical for partial discharges, may be facilitated.

Figure 6:
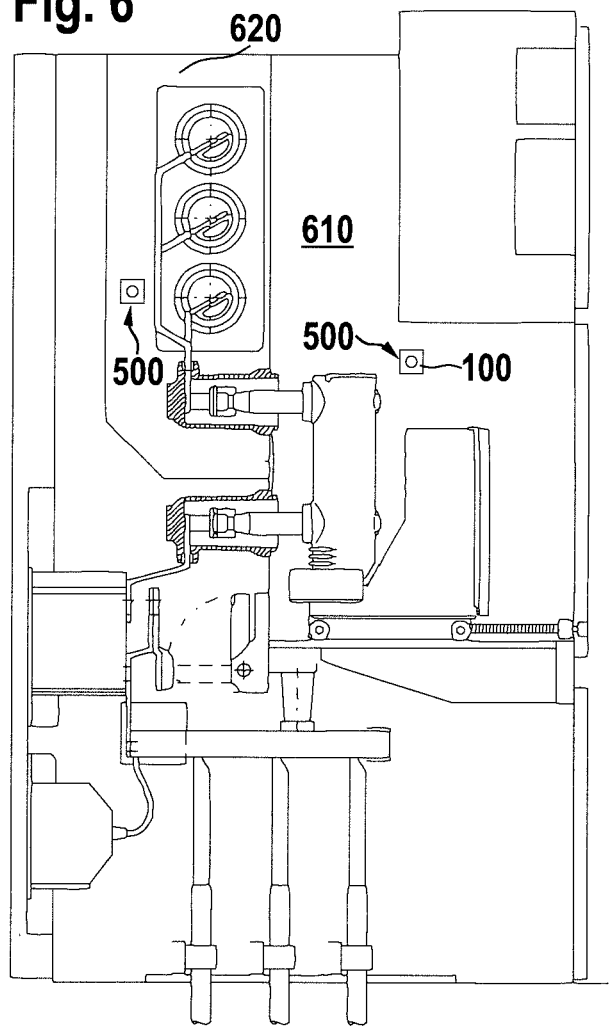
FIG. 6 is a schematic cross-sectional view of an electrical switchgear including a sensing device according to embodiments of the present disclosure.

FIG. 6 is a schematic cross-sectional view of an electrical switchgear including a sensing arrangement for detection of electrical discharges in an electrical apparatus, wherein the sensing arrangement includes an acoustic sensor and a signal enhancing structure with a funnel region. The sensing arrangement may correspond to the sensing arrangements as described in the present disclosure, particularly with regard to FIGS. 1-4.

The electrical switchgear may be a medium voltage or a high voltage electrical switchgear. The electrical switchgear may include a first compartment 610. The sensing arrangement 100 may be positioned such that it is acoustically linked to the first compartment 610. For example, the sensing arrangement may be attached to a wall of the compartment, particularly to an outer or to an inner side of the wall. Attaching the sensing arrangement to an outer side of a compartment's wall may prevent interference with dielectric strength.

The sensing arrangement 100 may be a part of a sensing device 500. In embodiments, the sensing arrangement may be positioned within the first compartment. According to an aspect, the sensing arrangement 100 may be positioned in proximity to an expected acoustic source of interest.

The electrical switchgear may include a further sensing arrangement 500 according to embodiments described herein. The further sensing arrangement 620 may be acoustically linked to a second compartment 620. The two sensing arrangements 500 may be connected to a common controller.

The present disclosure further relates to a method for detecting electrical discharges, particularly partial discharges. The method includes operating a sensing arrangement according to embodiments of the present disclosure to detect electrical discharges.

The invention claimed is:

1. A sensing arrangement for detection of electrical discharges in an electrical apparatus, wherein the sensing arrangement comprises an acoustic sensor and a signal enhancing structure with a funnel region, wherein the acoustic sensor is positioned outside the funnel region on an apex side of the funnel region, wherein in the funnel region, a part of a surface of the signal enhancing structure has an exponential-like cross section, and wherein the signal enhancing structure is configured as a high-pass filter with a cut-off frequency higher than 10 kHz.

2. The sensing arrangement according to claim 1, wherein the cut-off frequency is lower than 20 kHz.

3. The sensing arrangement according to claim 1, wherein a ratio between an entrance area and an exit area of the signal enhancing structure is larger than 10.

4. The sensing arrangement according to claim 1, wherein a ratio between an entrance area and an exit area of the signal enhancing structure is smaller than 40000.

5. The sensing arrangement according to claim 1, wherein the acoustic sensor includes a MEMS microphone.

6. A sensing device, including an enclosure and a sensing arrangement for detection of electrical discharges in an electrical apparatus, wherein the sensing arrangement comprises:

an acoustic sensor and a signal enhancing structure with a funnel region, wherein the acoustic sensor is positioned outside the funnel region on an apex side of the funnel region, wherein the signal enhancing structure of the sensing arrangement is embedded into the enclosure, wherein in the funnel region, a part of a surface of the signal enhancing structure has an exponential-like cross section, and wherein the signal enhancing structure is configured as a high-pass filter with a cut-off frequency higher than 10 kHz.

7. The sensing device according to claim 6, wherein the cut-off frequency is lower than 20 kHz.

8. The sensing device according to claim 6, wherein a ratio between an entrance area and an exit area of the signal enhancing structure is larger than 10.

9. The sensing device according to claim 6, wherein a ratio between an entrance area and an exit area of the signal enhancing structure is smaller than 40000.

10. The sensing device according to claim 6, wherein the acoustic sensor includes a MEMS microphone.

11. An electrical switchgear, including a sensing arrangement for detection of electrical partial discharges in an electrical apparatus, wherein the sensing arrangement includes an acoustic sensor and a signal enhancing structure with a funnel region, wherein the acoustic sensor is positioned outside the funnel region on an apex side of the funnel region, wherein in the funnel region, a part of a surface of the signal enhancing structure has an exponential-like cross section, and wherein the signal enhancing structure is configured as a high-pass filter with a cut-off frequency higher than 10 kHz.

12. The electrical switchgear according to claim 11, including a first compartment, wherein the sensing arrangement is positioned such that it is acoustically linked with the first compartment.

13. The electrical switchgear according to claim 12, wherein the sensing arrangement is mounted to a wall of the first compartment.

14. The electrical switchgear according to claim 11, including a further sensing arrangement having an acoustic sensor and a signal enhancing structure with a funnel region, wherein the sensing arrangement and the further sensing arrangement are connected to a common controller.

15. The electrical switchgear according to claim 11, wherein the cut-off frequency is lower than 20 kHz.

16. The electrical switchgear according to claim 11, wherein a ratio between an entrance area and an exit area of the signal enhancing structure is larger than 10.

17. The electrical switchgear according to claim 11, wherein a ratio between an entrance area and an exit area of the signal enhancing structure is smaller than 40000.

18. The electrical switchgear according to claim 11, wherein the acoustic sensor includes a MEMS microphone.

19. A method for detecting electrical discharges, the method comprising:
   operating a sensing arrangement for detection of electrical discharges in an electrical apparatus, wherein the sensing arrangement includes an acoustic sensor and a signal enhancing structure with a funnel region, wherein the acoustic sensor is positioned outside the funnel region on an apex side of the funnel region, wherein in the funnel region, a part of a surface of the signal enhancing structure has an exponential-like cross section, and wherein the signal enhancing structure is configured as a high-pass filter with a cut-off frequency higher than 10 kHz.

* * * * *